US012781125B2

(12) United States Patent
Park et al.

(10) Patent No.: US 12,781,125 B2
(45) Date of Patent: Nov. 3, 2026

(54) ETCHING COMPOSITION FOR ETCHING MOLYBDENUM FILM AND METHOD OF MANUFACTURING INTEGRATED CIRCUIT DEVICE USING THE SAME

(71) Applicant: SAMSUNG ELECTRONICS CO., LTD., Suwon-si (KR)

(72) Inventors: Changjun Park, Hwaseong-si (KR); Jaesung Lee, Seongnam-si (KR); Junghun Lim, Seongnam-si (KR); Mihyun Park, Seoul (KR); Sangwon Bae, Suwon-si (KR); Jungmin Oh, Incheon (KR); Hyosan Lee, Seongnam-si (KR)

(73) Assignees: SAMSUNG ELECTRONICS CO., LTD.; SOULBRAIN CO., LTD.

( * ) Notice: Subject to any disclaimer, the term of this patent is extended or adjusted under 35 U.S.C. 154(b) by 495 days.

(21) Appl. No.: 18/081,899

(22) Filed: Dec. 15, 2022

(65) Prior Publication Data

US 2023/0272278 A1 Aug. 31, 2023

(30) Foreign Application Priority Data

Feb. 25, 2022 (KR) ........................ 10-2022-0025509

(51) Int. Cl.

| | |
|---|---|
| ***C09K 13/06*** | (2006.01) |
| ***C23F 1/30*** | (2006.01) |
| ***H10P 14/40*** | (2026.01) |
| ***H10P 50/66*** | (2026.01) |
| ***H10W 20/00*** | (2026.01) |

(52) U.S. Cl.
CPC ................ *C09K 13/06* (2013.01); *C23F 1/30* (2013.01); *H10P 14/412* (2026.01); *H10P 50/667* (2026.01); *H10W 20/056* (2026.01)

(58) Field of Classification Search
None
See application file for complete search history.

(56) References Cited

U.S. PATENT DOCUMENTS

| | | | | |
|---|---|---|---|---|
| 6,797,621 | B2 | 9/2004 | Song et al. | |
| 9,530,670 | B2 | 12/2016 | Han et al. | |
| 10,332,909 | B2 | 6/2019 | Lee et al. | |
| 10,655,231 | B2 | 5/2020 | Takahashi et al. | |
| 11,028,488 | B2 | 6/2021 | Kim et al. | |
| 2015/0200112 | A1 * | 7/2015 | Han | H01L 21/32133 216/13 |

(Continued)

FOREIGN PATENT DOCUMENTS

| | | | | | |
|---|---|---|---|---|---|
| CN | 107304476 | A | * 10/2017 | | C09K 13/06 |
| JP | 2010-232486 | A | 10/2010 | | |

(Continued)

*Primary Examiner* — Duy N Deo
*Assistant Examiner* — Andrew Keelan Laobak
(74) *Attorney, Agent, or Firm* — Muir Patent Law, PLLC

(57) ABSTRACT

An etching composition for etching a molybdenum film, the etching composition includes about 0.1 wt % to about 5 wt % of an oxidant; about 10 wt % to about 40 wt % of a chelating agent, the chelating agent including a mineral acid; about 0.01 wt % to about 3 wt % of a corrosion inhibitor, the corrosion inhibitor including an ammonium salt, an amine compound, or a combination thereof; and an organic solvent, all wt % being based on a total weight of the etching composition.

17 Claims, 12 Drawing Sheets

(56) References Cited

U.S. PATENT DOCUMENTS

| | | | | |
|---|---|---|---|---|
| 2017/0321121 | A1* | 11/2017 | Yoo | C07C 69/02 |
| 2019/0119571 | A1* | 4/2019 | Mizutani | C09K 13/06 |
| 2019/0267395 | A1* | 8/2019 | Lee | H10B 43/27 |
| 2020/0010959 | A1* | 1/2020 | Hong | H01L 21/30604 |
| 2021/0324525 | A1* | 10/2021 | Das | C23F 1/38 |

FOREIGN PATENT DOCUMENTS

| | | | |
|---|---|---|---|
| JP | 2013-237873 | A | 11/2013 |
| KR | 10-0364831 | B1 | 12/2002 |
| KR | 10-2007-0077113 | A | 7/2007 |
| KR | 10-0944300 | B1 | 2/2010 |
| KR | 10-1216651 | B1 | 12/2012 |
| KR | 10-2014-0019991 | A | 2/2014 |
| KR | 10-1728542 | B1 | 4/2017 |
| KR | 10-2017-0120504 | A | 10/2017 |
| KR | 1020190041708 | A | 4/2019 |
| KR | 10-2161019 | B1 | 9/2020 |

* cited by examiner

ETCHING COMPOSITION FOR ETCHING MOLYBDENUM FILM AND METHOD OF MANUFACTURING INTEGRATED CIRCUIT DEVICE USING THE SAME

CROSS-REFERENCE TO RELATED APPLICATION

This application is based on and claims priority under 35 U.S.C. § 119 to Korean Patent Application No. 10-2022-0025509, filed on Feb. 25, 2022, in the Korean Intellectual Property Office, the disclosure of which is incorporated by reference herein in its entirety.

BACKGROUND

1. Field

Embodiments relate to an etching composition for etching a molybdenum film and a method of manufacturing an integrated circuit device by using the same.

2. Description of the Related Art

According to the large capacity and high degree of integration of an integrated circuit device, a vertical memory device, which increases the capacity of memory by stacking, on a substrate, a plurality of memory cells in the vertical direction, has been proposed.

SUMMARY

The embodiments may be realized by providing an etching composition for etching a molybdenum film, the etching composition including about 0.1 wt % to about 5 wt % of an oxidant; about 10 wt % to about 40 wt % of a chelate agent, the chelate agent including a mineral acid; about 0.01 wt % to about 3 wt % of a corrosion inhibitor, the corrosion inhibitor including an ammonium salt, an amine compound, or a combination thereof; and an organic solvent, all wt % being based on a total weight of the etching composition.

The embodiments may be realized by providing a method of manufacturing an integrated circuit device, the method including forming, on a substrate, an insulating film structure defining a plurality of spaces arranged apart from each other; forming a molybdenum film filling the plurality of spaces and covering the insulating film structure; and removing a part of the molybdenum film from outside of the plurality of spaces by using an etching composition to obtain a plurality of molybdenum patterns filling the plurality of spaces and spaced apart from each other, wherein the etching composition includes about 0.1 wt % to about 5 wt % of an oxidant; about 10 wt % to about 40 wt % of a chelate agent, the chelate agent including a mineral acid; about 0.01 wt % to about 3 wt % of a corrosion inhibitor, the corrosion inhibitor including an ammonium salt, an amine compound, or a combination thereof; and an organic solvent, all wt % being based on a total weight of the etching composition.

The embodiments may be realized by providing a method of manufacturing an integrated circuit device, the method including forming, on a substrate, a structure in which a plurality of first films and a plurality of second films are stacked alternately one by one; forming a channel hole penetrating the structure in a vertical direction; forming a channel structure in the channel hole; forming a word line cut area penetrating the structure in the vertical direction and extending in a shape of a line in a first horizontal direction;

forming a plurality of word line spaces by removing the plurality of first films exposed in the word line cut area; forming a molybdenum film filling the plurality of word line spaces and covering surfaces of the plurality of second films exposed in the word line cut area; and removing a part of the molybdenum film by applying an etching composition through the word line cut area to obtain a plurality of word lines including a plurality of molybdenum patterns filling the plurality of word line spaces and arranged apart from each other, wherein the etching composition includes about 0.1 wt % to about 5 wt % of an oxidant; about 10 wt % to about 40 wt % of a chelate agent, the chelate agent including a mineral acid; about 0.01 wt % to about 3 wt % of a corrosion inhibitor, the corrosion inhibitor including an ammonium salt, an amine compound, or a combination thereof; and an organic solvent, all wt % being based on a total weight of the etching composition.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
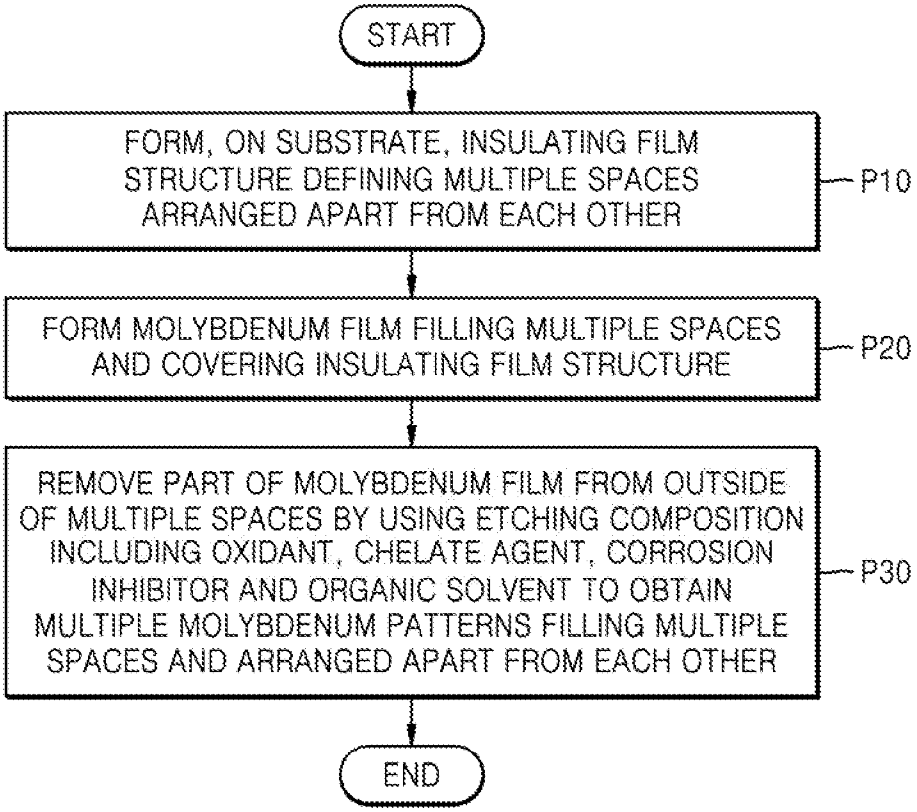
FIG. 1 is a flowchart for explaining a method of manufacturing an integrated circuit device, according to embodiments.

An etching composition according to embodiments may include, e.g., an oxidant, a chelate agent including a mineral acid, a corrosion inhibitor including ammonium salt, an amine compound, or a combination thereof, and (e.g., a balance of) an organic solvent.

The etching composition according to embodiments may include, e.g., the oxidant having a content of about 0.1 wt % to about 5 wt % based on a total weight of the etching composition, the chelate agent having a content of about 10 wt % to about 40 wt % based on the total weight of the etching composition, and the corrosion inhibitor having a content of about 0.01 wt % to about 3 wt % based on the total weight of the etching composition. In an implementation, the organic solvent may be present in the remaining amount excluding the contents of the oxidant, the chelate agent, and the corrosion inhibitor.

In the etching composition according to embodiments, the oxidant may include, e.g., nitric acid, sulfuric acid, perchloric acid, ammonium persulfate, methanesulfonic acid, para-toluenesulfonic acid, or a combination thereof. In an implementation, the oxidant may include nitric acid or sulfuric acid. As used herein, the term "or" is not an exclusive term, e.g., "A or B" would include A, B, or A and B.

In the etching composition according to embodiments, the chelate agent may include, e.g., phosphoric acid, a phosphoric acid salt, phosphonic acid, a phosphonic acid salt, or a combination thereof. In an implementation, the chelate agent may include phosphoric anhydride, polyphosphate, phenylphosphonic acid, aminotris (methylenephosphonic acid), 1-hydroxyethylene-1, 1-diphosphonate, methylphosphonic acid, or a combination thereof.

In the etching composition according to embodiments, when the corrosion inhibitor includes ammonium salt, the ammonium salt may include, e.g., monoammonium phosphate, diammonium phosphate, triammonium phosphate, ammonium chloride, ammonium acetate, ammonium carbonate, ammonium nitrate, ammonium sulfate, or a combination thereof.

In the etching composition according to embodiments, when the corrosion inhibitor includes an amine compound, the amine compound may include, e.g., a C1-C8 aliphatic amine compound or a 5-membered to 8-membered cyclic amine compound.

In an implementation, the amine compound may include, e.g., ethylamine, isopropylamine, dimethylbutylamine (DMBA), diisopropylethylamine, or an aliphatic polyamine. The aliphatic polyamine may include, e.g., an amine compound having at least two amino groups. The aliphatic polyamine may include, e.g., a polyamine having a linear or branched hydrocarbon group. In an implementation, the aliphatic polyamine may include, e.g., ethylenediamine (EDA), demethylaminoethylmethylamine, 1,2-propylenediamine, 1,3-propylenediamine, 1,4-butanediamine, 1,3-diaminopentane, hexamethylenediamine, 2-methyl-pentamethylenediamine, or a combination thereof.

In an implementation, the aliphatic polyamide may include, e.g., pyrrole, oxazole, imidazole, methylimidazole, pyrazole, triazole, aminotriazole, tetrazole, 5-aminotetrazole, methyltetrazole, piperazine, methylpiperazine, hydroxyethylpiperazine, pyrrolidine, alloxan, or a combination thereof.

In the etching composition according to embodiments, the organic solvent may include a non-aqueous organic solvent, e.g., a C1-C5 carboxylic acid compound, a C1-C5 alcohol compound, a C1-C5 carbonic acid ester compound, or a combination thereof.

In an implementation, the organic solvent may include, e.g., acetic acid, methyl acetate, ethyl acetate, propyl acetate, isopropyl acetate, ethanol, methanol, butanol, propanol, ethylene carbonate, diethyl carbonate, dimethyl carbonate, ethyl methyl carbonate, propylene carbonate, methyl propyl carbonate, or a combination thereof.

In an implementation, the etching composition may not include water. In an implementation, the etching composition may further include water having a content greater than about 0 wt % and less than about 1 wt % based on the total weight of the etching composition. In an implementation, when at least one of the oxidant and the chelate agent included in the etching composition includes a material having a purity less than 100%, the etching composition may not include additional water.

In an implementation, the etching composition may not include hydrogen peroxide ($H_2O_2$).

The etching composition according to embodiments may etch a molybdenum (Mo) film at a controlled speed, and inhibit generation of residue in the process of etching the Mo film. Mo is a metal, which is relatively vulnerable to oxidation. Accordingly, when the Mo film is removed by using another etching composition, due to the fast etching speed, it may be difficult to control the etching quantity of the Mo film. Moreover, undesired residue could be generated during the etching of the Mo film, and the manufacturing process of an integrated circuit device may be complex.

In the etching composition according to embodiments, the oxidant may oxidize Mo atoms included in the Mo film, which is a target of etching. The resulting Mo oxide may be dissolved by the chelate agent. In an implementation, when nitric acid is used as the oxidant, the Mo atoms included in the Mo film may be oxidized into Mo oxides, and, e.g., molybdenum oxide ($MoO_3$) may be obtained. When phosphoric anhydride is used as the chelate agent, the Mo oxides may be dissolved by the phosphoric anhydride, and the dissolution reaction may be performed according to the following reaction formula or a similar reaction.

$$12MoO_3+H_3PO_4 \rightarrow H_3PMo_{12}O_{40}$$

In the etching composition of embodiments, the etching composition may include the oxidant and the chelate agent, and a second etching process may be performed through the oxidation and dissolution of the Mo film. In an implementation, by properly controlling the contents of the oxidant and the chelate agent included in the etching composition and a ratio therebetween, the oxidation speed of the Mo film by the oxidant and the dissolution speed of the Mo film by the chelate agent may be controlled as well.

The corrosion inhibitor included in the etching composition according to embodiments may coordinate-bond to the Mo atoms on a surface of the etching target Mo film to reduce a reaction site of the Mo atoms and thus may function as an inhibitor for Mo etching. In an implementation, the etching composition according to embodiments may include the corrosion inhibitor, and the speed of additional etching of the Mo film may be controlled. Accordingly, the etching speed may be easily controlled to maintain the etching quantity of the Mo film according to a position constant.

The etching composition according to embodiments may not include water, or even when the etching composition includes water, the content of the water may be less than about 1 wt % in the total weight of the etching composition. As such, by posing a limit on the content of water in the etching composition as much as possible, when etching the Mo film by using the etching composition, generation of materials, which are not easily dissolved by the chelate agent, e.g., Mo dioxide, may be inhibited, which leads to inhibition of undesired residue formation during the etching process of the Mo film.

Accordingly, in the process of manufacturing an integrated circuit device by using the etching composition according to embodiments to etch the Mo film, the manufacturing process of an integrated circuit device may be simplified, and the reliability of resulting integrated circuit devices may also be improved.

FIG. 1 is a flowchart of a method of manufacturing an integrated circuit device, according to embodiments.

In operation P10 of FIG. 1, an insulating film structure defining a plurality of spaces arranged apart from each other may be formed on a substrate.

The substrate may be a semiconductor substrate. In an implementation, the semiconductor substrate may include a semiconductor element, e.g., Si, Ge, or the like, or a compound semiconductor, e.g., silicon carbide (SiC), gallium arsenide (GaAs), indium arsenide (InAs), indium phosphide (InP), or the like.

The insulating film structure may include a silicon oxide film, a silicon nitride film, or a combination thereof. In an implementation, the plurality of spaces may extend (e.g., lengthwise) in a direction parallel with a main surface of the substrate, and may overlap each other in a direction perpendicular to the main surface of the substrate.

In operation P20 of FIG. 1, the Mo film filling the plurality of spaces limited by the insulating film structure and covering the insulating film structure may be formed. In an implementation, the Mo film may be formed by using an atomic layer deposition (ALD) process.

In operation P30 of FIG. 1, a part of the Mo film may be removed from the outside of the plurality of spaces limited by the insulating film structure by using the etching composition to form a plurality of Mo patterns filling the plurality of spaces and arranged apart from each other. The specifics of the etching composition are as described above in regard of the etching compositions according to embodiments.

In an implementation, in the etching composition, the oxidant may include nitric acid, the chelate agent may include phosphoric anhydride, the corrosion inhibitor may include an aliphatic polyamine, and the organic solvent may include a non-aqueous organic solvent including a C1-C5 carboxylic acid compound.

In an implementation, the etching composition may not include water. In an implementation, the etching composition may further include water having a content greater than about 0 wt % and less than about 1 wt % based on the total weight of the etching composition. In an implementation, at least one of the oxidant and the chelate agent included in the etching composition may include a material having a purity less than 100%. In an implementation, a 70% nitric acid reagent, which is available in the market, may be used as the oxidant, and an 85% phosphoric acid reagent, which is available in the market, may be used as the chelate agent. In this case, the nitric acid reagent or the phosphoric acid reagent may already include water. As such, when at least one of the oxidant and the chelate agent of the etching composition includes a material having a purity less than 100%, the etching composition may or may not include additional water.

In removing a part of the Mo film by using the etching composition according to operation P30 of FIG. 1, the speed of etching the Mo film by the etching composition may be less than 10 Å/min. In an implementation, the speed of etching the Mo film by the etching composition may range from, e.g., about 2 Å/min to about 9 Å/min, or from about 4 Å/min to about 8 Å/min. To control the speed of etching the Mo film by the etching composition to be in a desired range, the content of the corrosion inhibitor included in the etching composition, e.g., the content of the amine compound may be controlled to be within about 0.01 wt % to about 3 wt %. The higher the content of the corrosion inhibitor in the etching composition, the lower the speed of etching the Mo film by the etching composition.

In removing a part of the Mo film by using the etching composition according to operation P30 of FIG. 1, considering melting points of materials included in the etching composition, the process temperature may be selected within a temperature range higher than the melting point of each material and lower than or equal to room temperature (e.g., about 25° C.). In an implementation, the process temperature for etching the Mo film may be selected from a range from about 10° C. to about 30° C. In an implementation, a thermostat may be used to remove a part of the Mo film by using the etching composition under a constant temperature.

Figure 2A:
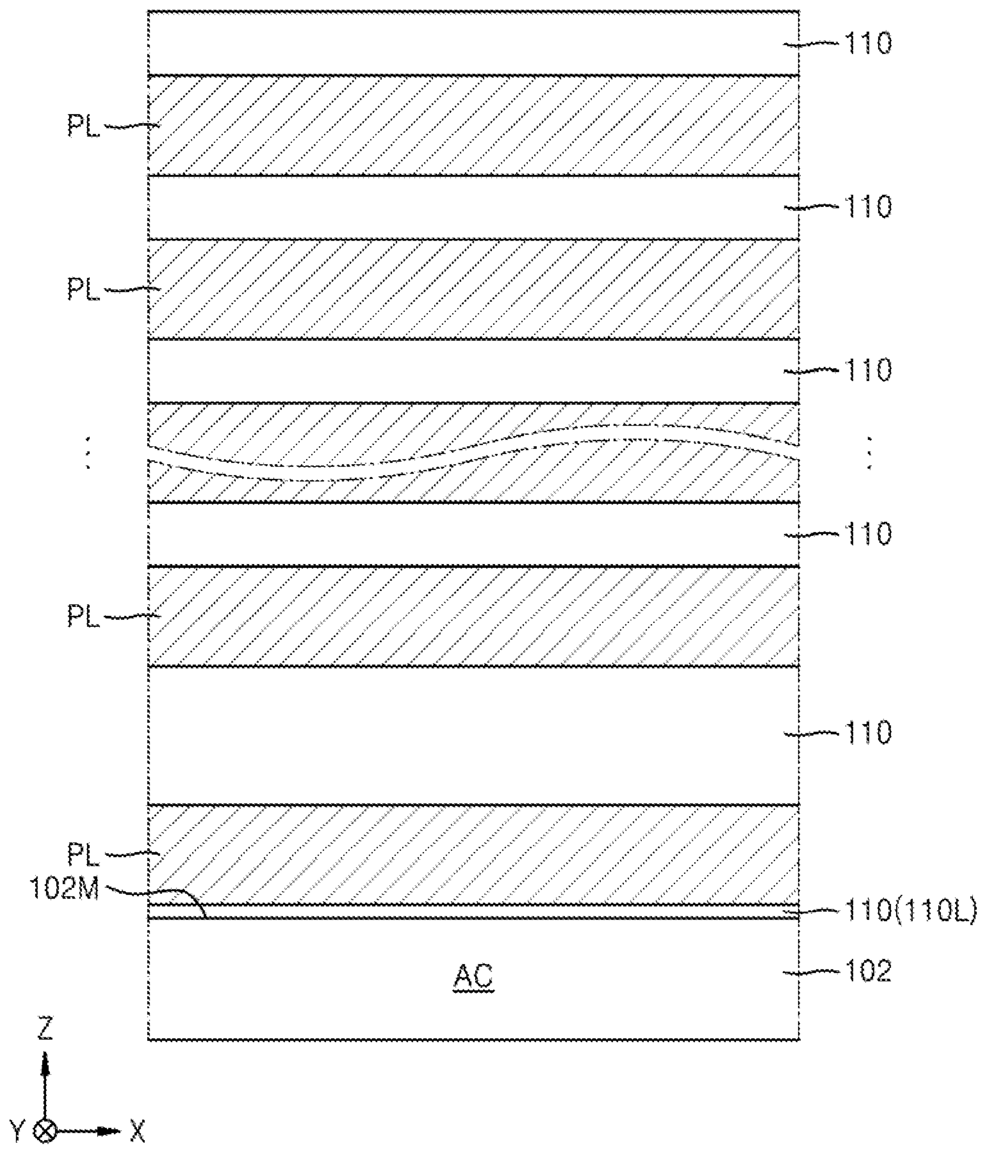
FIGS. 2A to 2J are cross-sectional views of stages in a method of manufacturing an integrated circuit device, according to other embodiments.
Figure 2B:
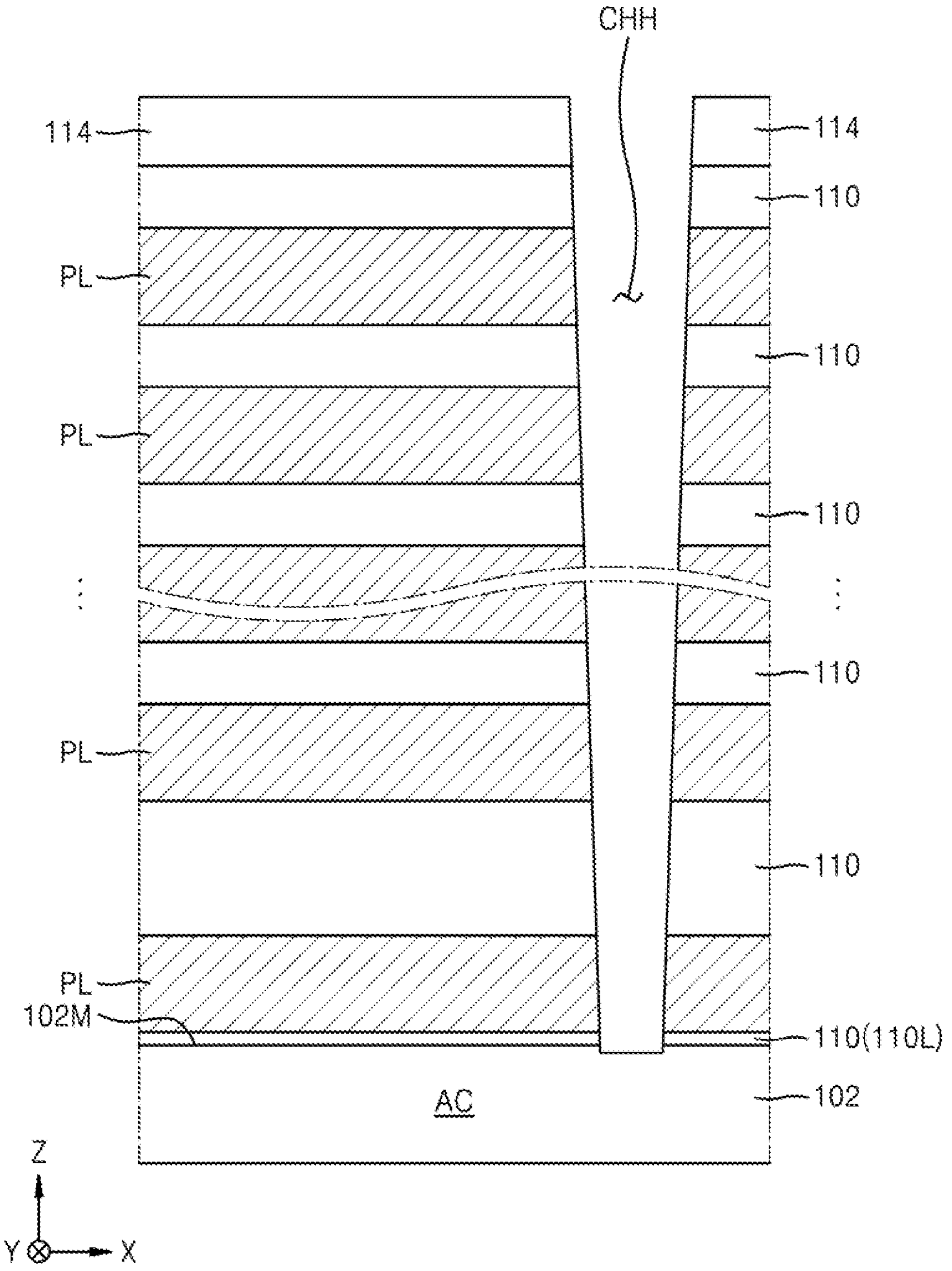
Figure 2C:
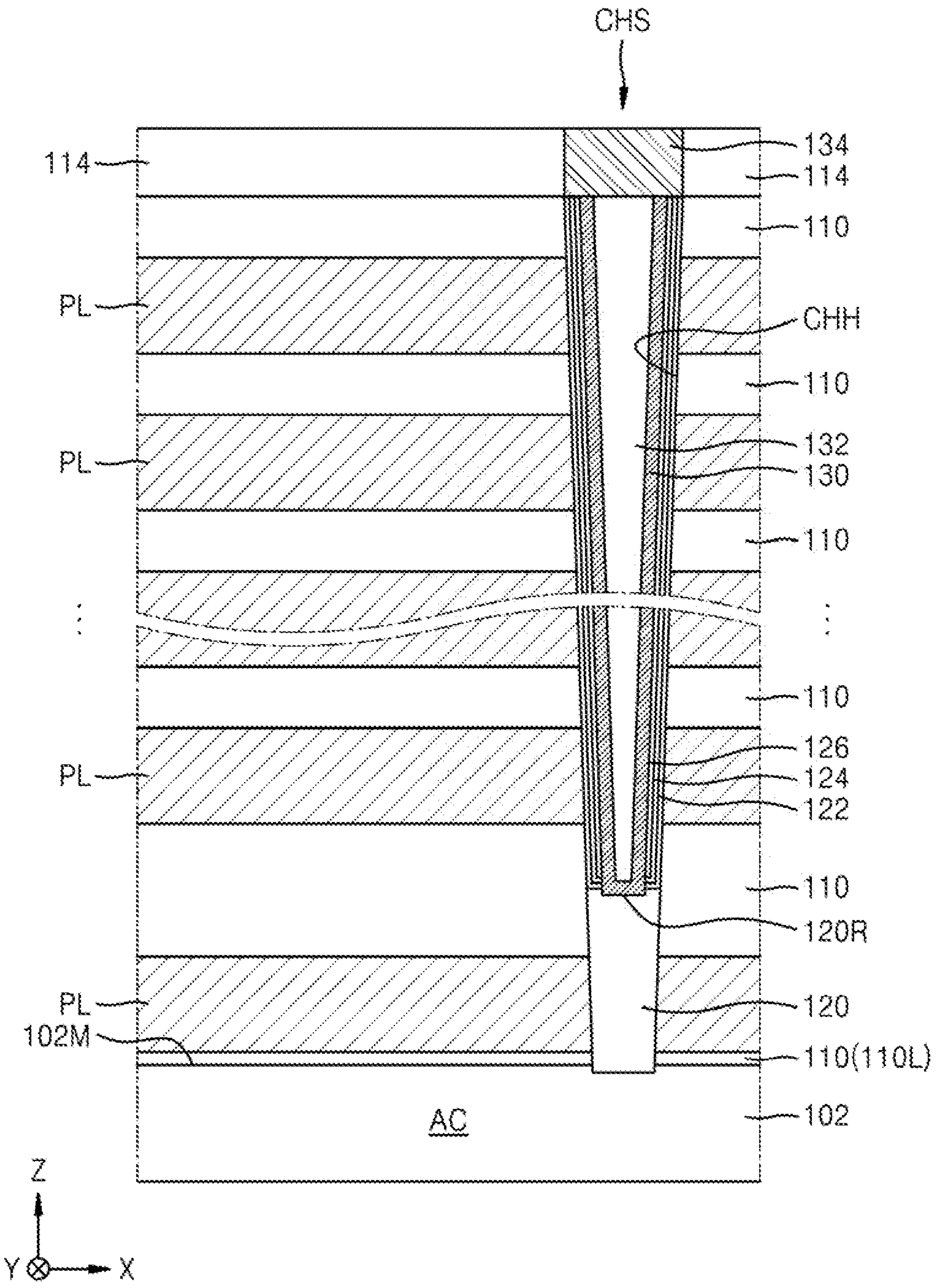
Figure 2D:
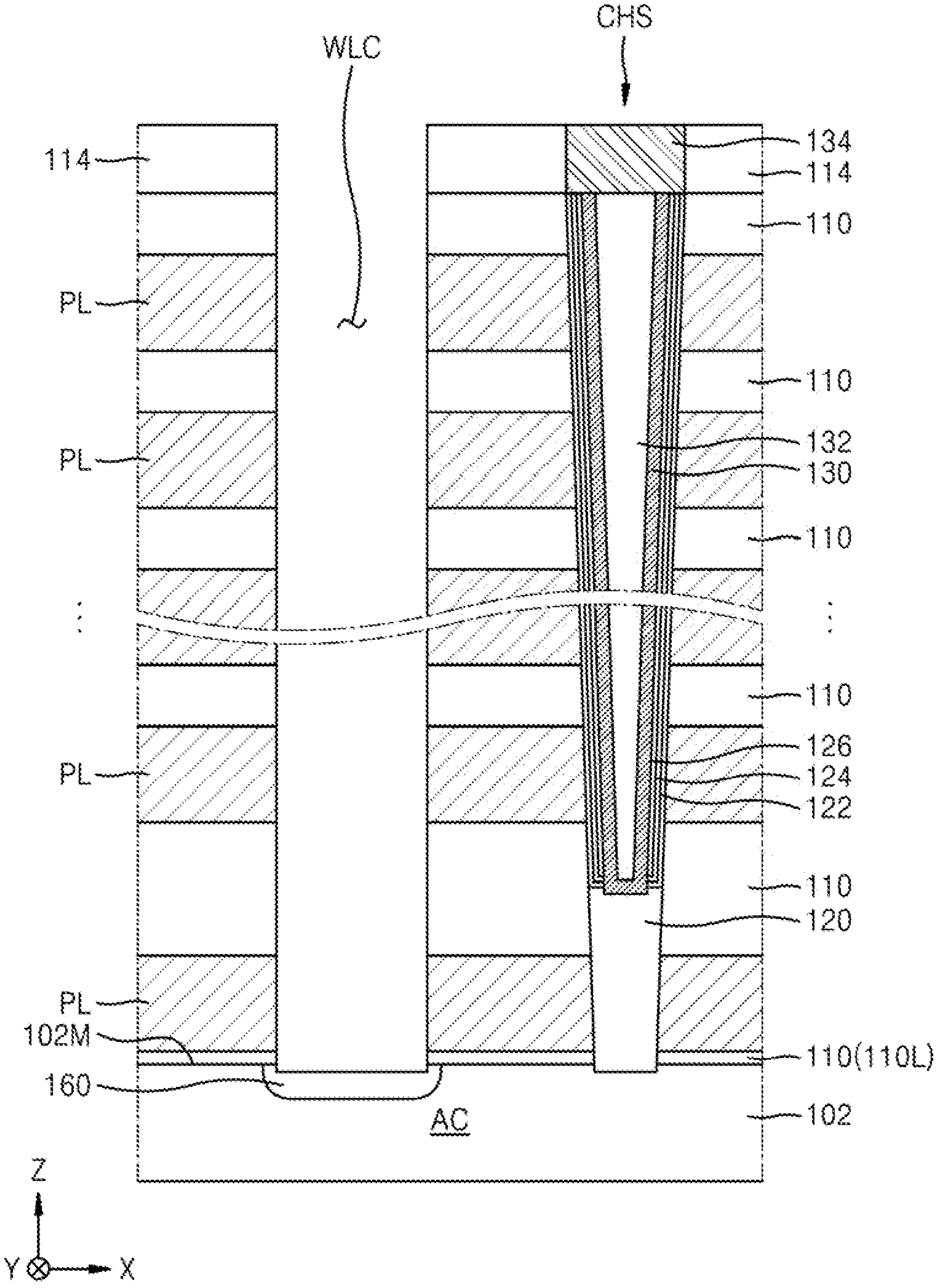
Figure 2E:
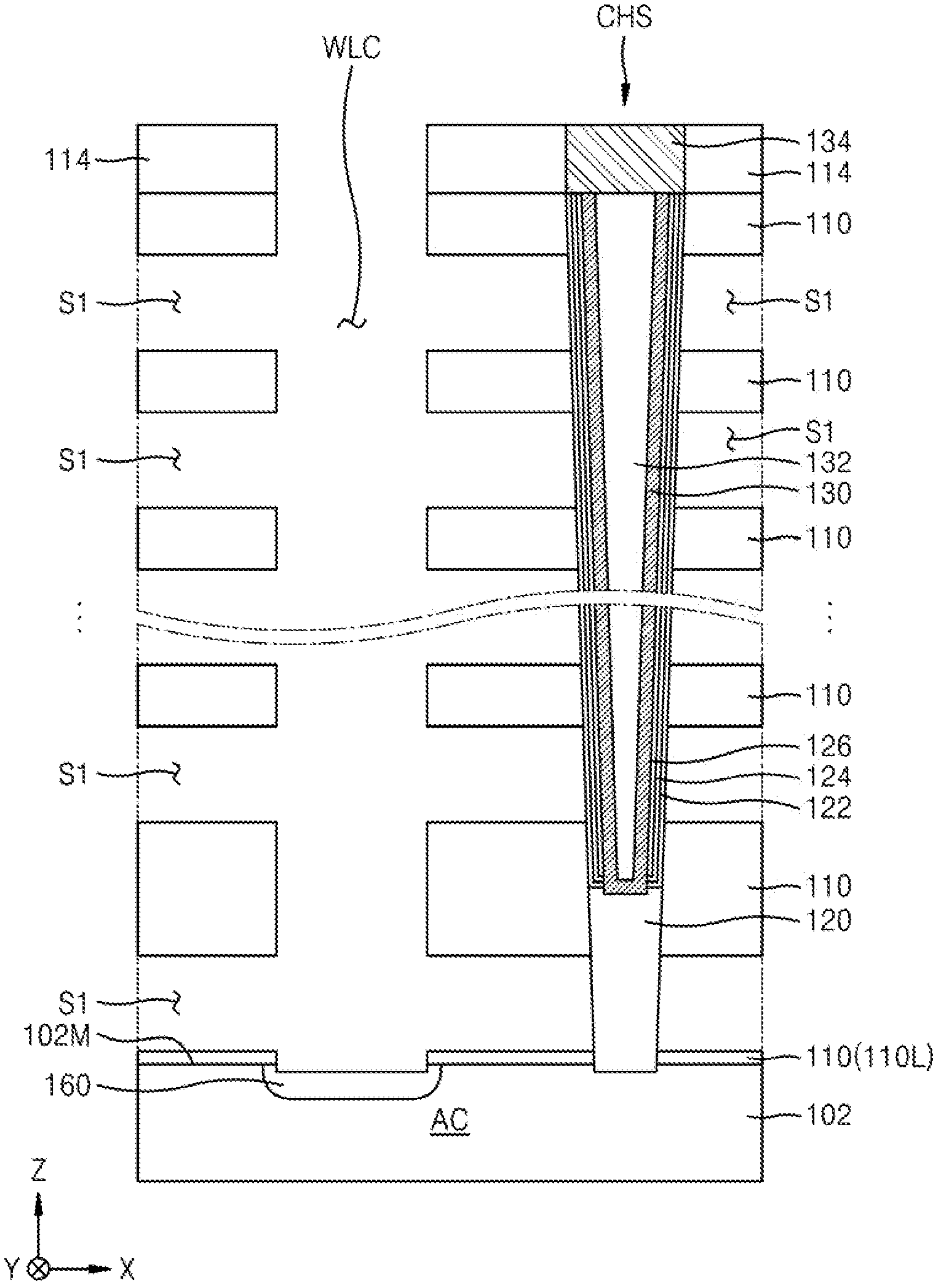
Figure 2F:
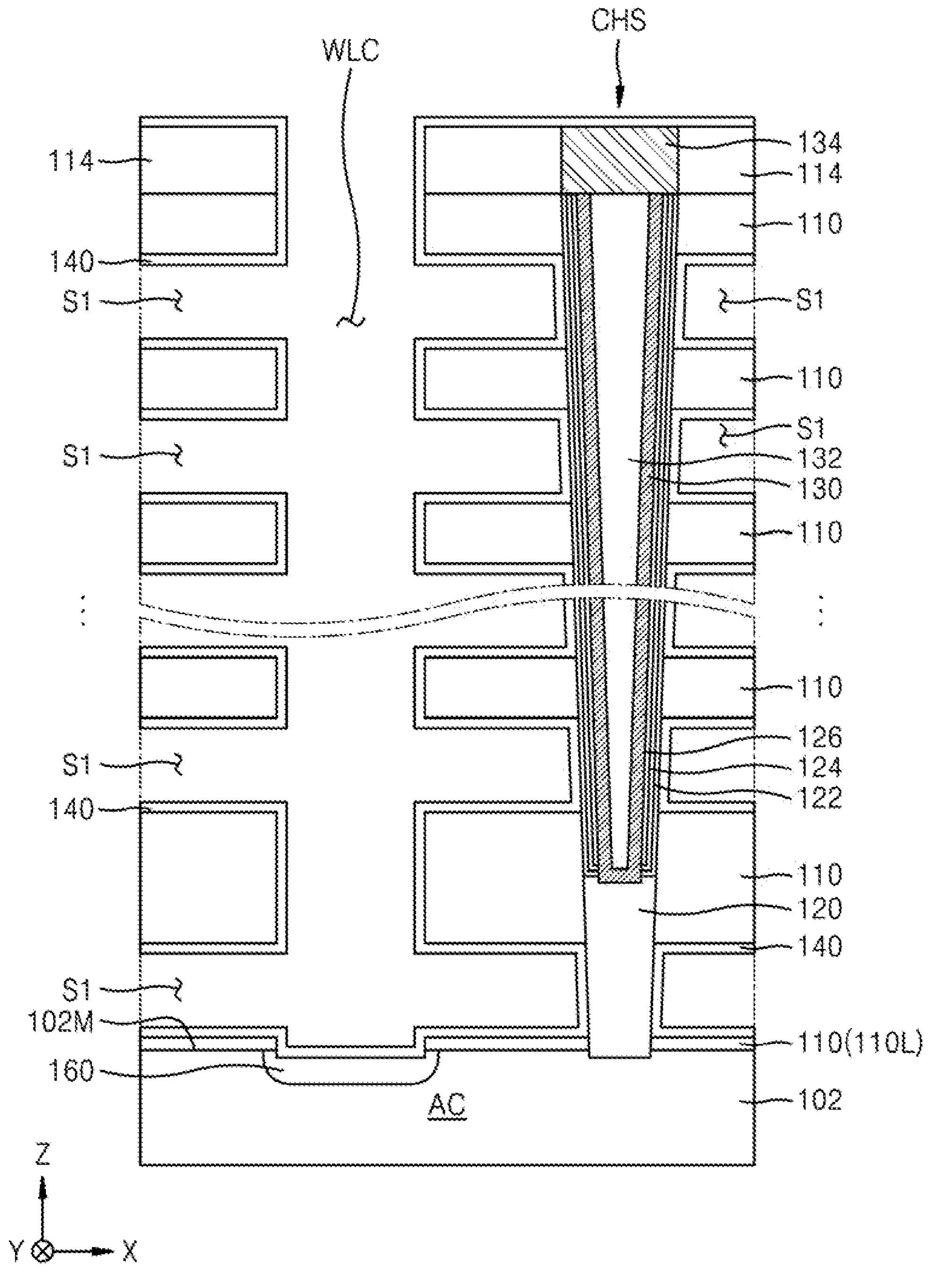
Figure 2G:
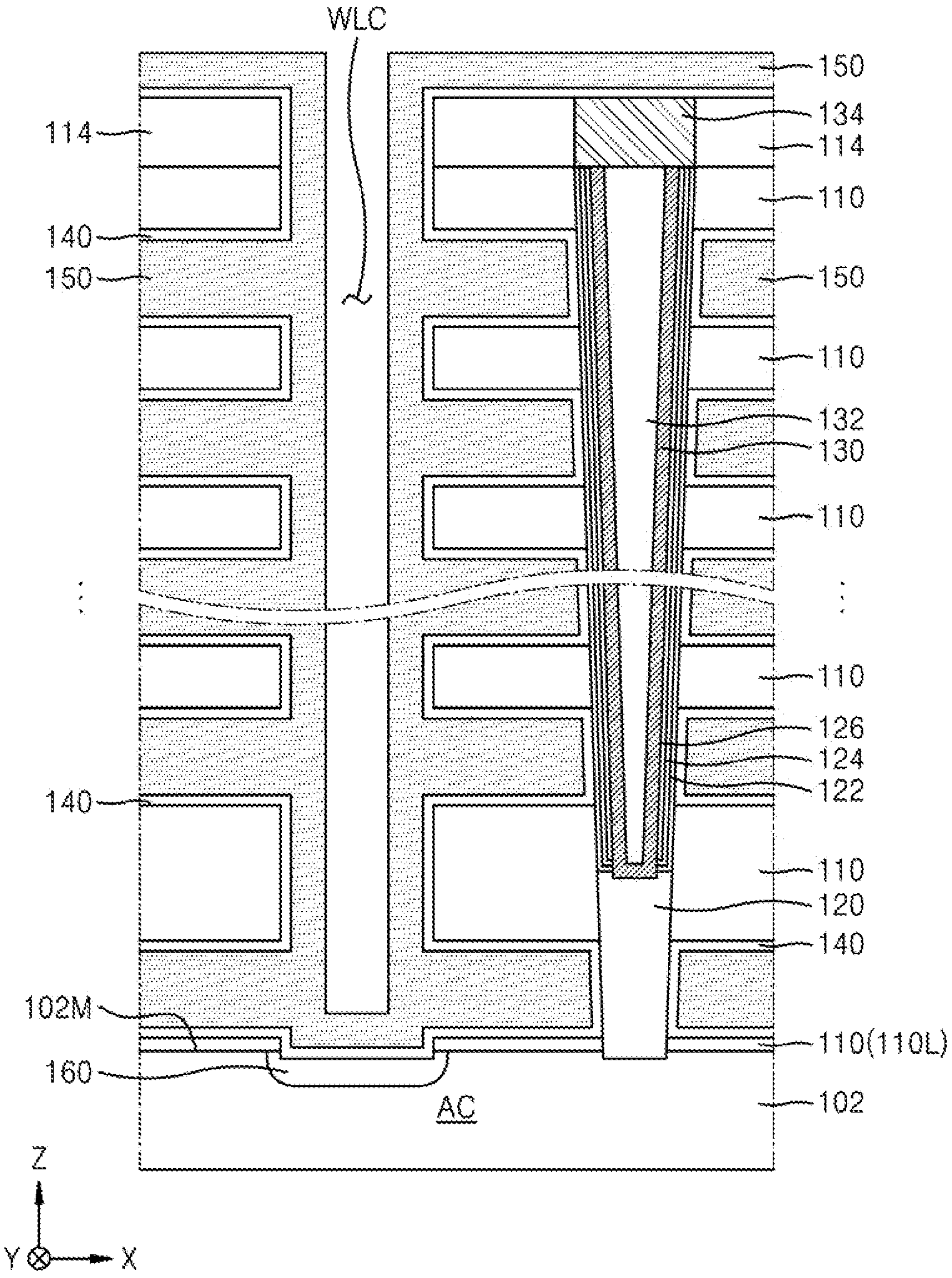
Figure 2H:
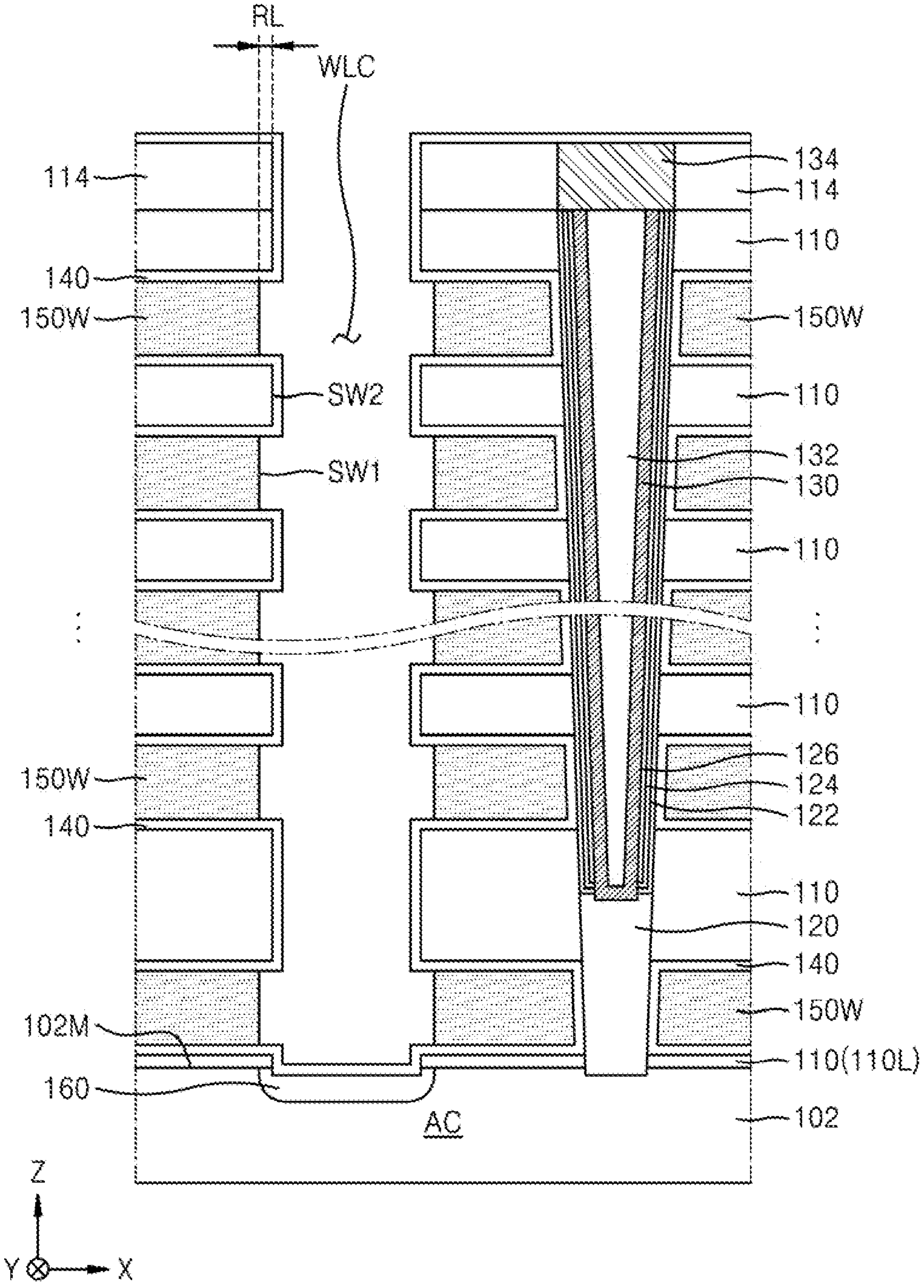
Figure 2I:
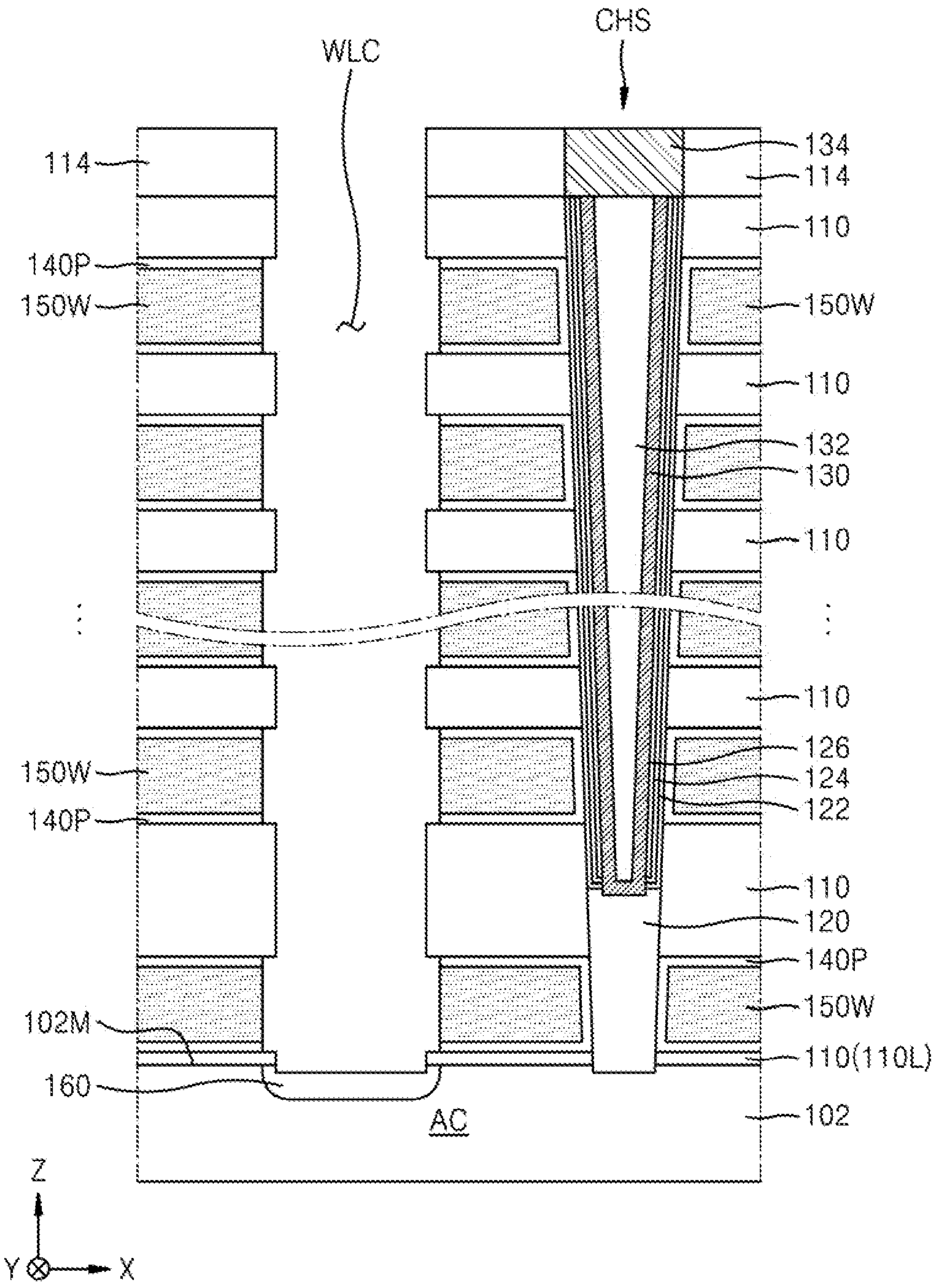
Figure 2J:
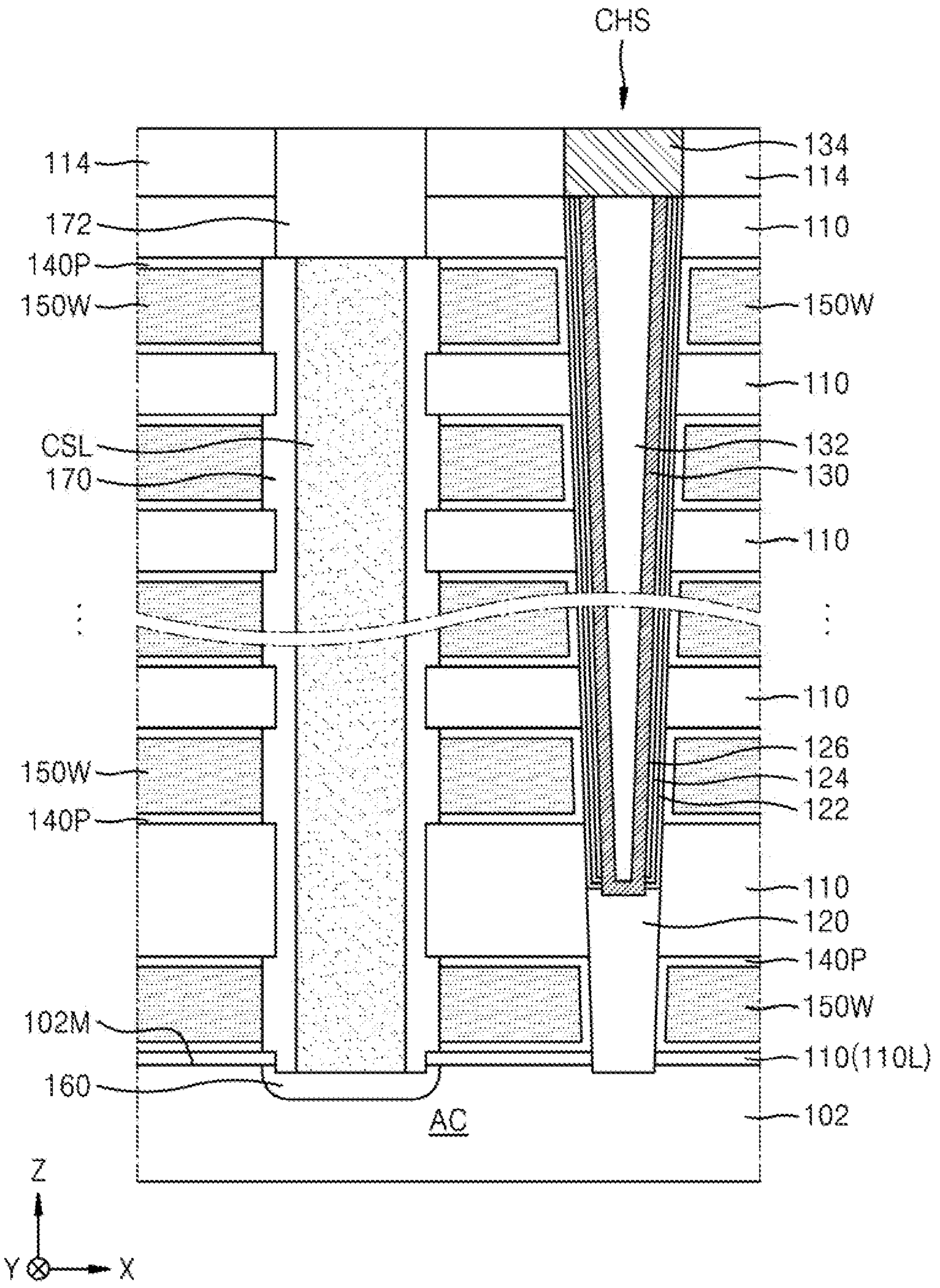

FIGS. 2A to 2J are cross-sectional views of stages in a method of manufacturing an integrated circuit device. With reference to FIGS. 2A and 2J, a method of manufacturing an integrated circuit device including a three-dimensional (3D) vertical NAND (VNAND) flash memory having a stacked structure in which a plurality of word lines are stacked and overlap each other in the vertical direction is described.

With reference to FIG. 2A, after forming a device isolation film to define an active area AC on a substrate 102, a structure in which a plurality of insulating films 110 and a plurality of sacrificial films PL are alternately stacked, one by one, may be formed on the substrate 102.

The substrate 102 may have a main surface 102M extending in the X direction and the Y direction (e.g., in an X-Y plane). In an implementation, the substrate 102 may include Si, Ge, or SiGe.

Among the plurality of insulating films 110, a lowest insulating film 110L in contact with the substrate 102 may be a single layer including a silicon oxide film. The thickness of the lowest insulating film 110L may be less than those of the other insulating films 110. In an implementation, the plurality of sacrificial films PL may include a silicon nitride film, and the plurality of insulating films 110 may include a silicon oxide film. Each of the plurality of insulating films 110 and the plurality of sacrificial films PL may be formed by a chemical vapor deposition (CVD) process, a plasma-enhanced CVD (PECVD) process, or an ALD process.

A structure in which the plurality of insulating films 110 and the plurality of sacrificial films PL are alternately stacked may be required to form a memory stack, and each of the plurality of sacrificial films PL may provide a space to form a plurality of word lines included in the memory stack in a subsequent process. The insulating film 110 formed directly on the first sacrificial film PL from the substrate 102 among the plurality of sacrificial films PL may have a greater thickness than the insulating films 110 formed at different positions. In an implementation, the structure in which the plurality of insulating films 110 and the plurality of sacrificial films PL are stacked alternately may be a structure required to form a memory stack including at least 50, at least 100, or at least 200 word lines stacked to overlap each other in the vertical direction (Z direction). In such a case, the structure may include at least 50, at least 100, or at least 200 sacrificial films PL stacked to overlap each other in the vertical direction (Z direction).

With reference to FIG. 2B, after forming an insulating pattern 114 on the outcome of FIG. 2A, by using the insulating pattern 114 as an etching mask, the plurality of insulating films 110 and the plurality of sacrificial films PL may be anisotropically etched to form a channel hole CHH. The channel hole CHH may penetrate the structure including the plurality of insulating films 110 and the plurality of sacrificial films PL in the vertical direction (Z direction), and the substrate 102 may be exposed at the bottom of the channel hole CHH. The horizontal width of the channel hole CHH may narrow towards the substrate 102. The insulating pattern 114 may include a single-layer or a multi-layer structure including an oxide film, a nitride film, or a combination thereof.

With reference to FIG. 2C, by performing a selective epitaxial growth process, which uses the substrate 102 exposed at the bottom of the channel hole CHH as a seed, a semiconductor pattern 120 partially filling the channel hole CHH may be formed. The upper surface of the semiconductor pattern 120 may be at a higher level than the upper surface of the sacrificial film PL closest to the substrate 102, among the plurality of sacrificial films PL. The semiconductor pattern 120 may provide a channel area. In some embodiments, the semiconductor pattern 120 may include a semiconductor film doped with impurities. In an implementation, the semiconductor pattern 120 may include a Si film doped with impurities or a Ge film doped with impurities.

In a result material at which the semiconductor pattern 120 is formed, a channel structure CHS may be formed in the channel hole CHH. The channel structure CHS may include a blocking dielectric film 122, a charge trap film 124, a tunneling dielectric film 126, a channel film 130, a buried insulating film 132, and a drain area 134 filling an upper portion at an inlet of the channel hole CHH. In the channel hole CHH, each of the blocking dielectric film 122, the charge trap film 124, the tunneling dielectric film 126, and the channel film 130 may have a shape of a cylinder.

In an implementation, the blocking dielectric film 122 may include a silicon oxide, a silicon nitride, or a metal oxide having a permittivity greater than that of a silicon oxide. The metal oxide may include a hafnium oxide, an aluminum oxide, a zirconium oxide, a tantalum oxide, or a combination thereof. The charge trap film 124 may include a silicon nitride, a boron nitride, a silicon boron nitride, or polysilicon doped with impurities. The tunneling dielectric film 126 may include a silicon oxide, a hafnium oxide, an aluminum oxide, a zirconium oxide, a tantalum oxide, or the like. The channel film 130 may include doped polysilicon or undoped polysilicon. The buried insulating film 132 may include a silicon oxide, a silicon nitride, a silicon oxynitride, or a combination thereof.

In a process of forming the blocking dielectric film 122, the charge trap film 124, the tunneling dielectric film 126, and the channel film 130 in the channel hole CHH, a part of the upper surface of the semiconductor pattern 120 may be removed, and a recess surface 120R may be formed on the upper surface of the semiconductor pattern 120. The channel film 130 may be in contact with the recess surface 120R of the semiconductor pattern 120.

In an implementation, as illustrated in FIG. 2C, the insulating pattern 114 may remain at the periphery of the drain area 134. In an implementation, during formation of the blocking dielectric film 122, the charge trap film 124, the tunneling dielectric film 126, the channel film 130, and the buried insulating film 132 in the channel hole CHH, the insulating pattern 114 may be removed to expose an upper surface of the uppermost insulating film 110, and then, a new insulating film covering the upper surface of the uppermost insulating film 110 may be formed. After forming a plurality of contact holes by etching areas of the insulating film corresponding to the channel hole CHH, the drain area 134 filling the plurality of contact holes may be formed. The drain area 134 may include polysilicon doped with impurities, a metal, a conductive metal nitride, or a combination thereof. A metal included in the drain area 134 may include, e.g., tungsten, nickel, cobalt, tantalum, or the like.

With reference to FIG. 2D, after forming a word line cut area WLC exposing the substrate 102 by anisotropically etching the insulating pattern 114, the plurality of insulating films 110, and the plurality of sacrificial films PL, by implanting impurity ions into the substrate 102 through the word line cut area WLC, a common source area 160 may be formed.

The word line cut area WLC may penetrate the structure including the plurality of insulating films 110 and the plurality of sacrificial films PL in the vertical direction (Z direction) and extend in a shape of a line in the horizontal direction (Y direction of FIG. 2D). The common source area 160 may be formed to extend in a shape of a line along the word line cut area WLC.

With reference to FIG. 2E, by removing the plurality of sacrificial films PL exposed in the word line cut area WLC, a plurality of word line spaces S1 may be formed between the plurality of insulating films 110.

Each of the plurality of word line spaces S1 may extend in a direction parallel with the main surface 102M of the substrate 102 and overlap each other in a direction perpendicular to the main surface 102M of the substrate 102 (Z direction). The plurality of word line spaces S1 may be connected to the word line cut area WLC. The blocking dielectric film 122 of the channel structure CHS may be exposed in the plurality of word line spaces S1.

With reference to FIG. 2F, a dielectric thin film 140 conformally covering surfaces exposed in the plurality of word line spaces S1 and the word line cut area WLC may be formed.

The dielectric thin film 140 may be formed to conformally cover the surfaces of the plurality of insulating films 110 and channel structure CHS exposed in the word line cut area WLC and the plurality of word line spaces S1.

In an implementation, the dielectric thin film 140 may include a high dielectric film having a dielectric constant higher than that of a silicon oxide. In an implementation, the dielectric thin film 140 may include an aluminum oxide film, a hafnium oxide film, a zirconium oxide film, or a tantalum oxide film.

With reference to FIG. 2G, a Mo film 150 filling remaining spaces of the plurality of word line spaces S1 in an outcome of FIG. 2F may be formed. The Mo film 150 may be formed to fill the spaces limited by the dielectric thin film 140, of the plurality of word line spaces S1, and a part of the word line cut area WLC outside each of the plurality of word line spaces S1. Parts of the dielectric thin film 140 outside each of the plurality of word line spaces S1 may cover side walls of the plurality of insulating films 110, with the dielectric thin film 140 arranged therebetween in the word line cut area WLC.

With reference to FIG. 2H, a part of the Mo film 150 may be removed by applying the etching composition through the word line cut area WLC in the outcome of FIG. 2G. As a result, a plurality of word lines 150W including the plurality of Mo patterns filling the plurality of word line spaces S1 (see FIG. 2F) and arranged apart from each other may be obtained on the dielectric thin film 140.

Of the plurality of word lines 150W, a first side wall SW1 facing the word line cut area WLC may be recessed to be away from the word line cut area WLC, by a recess length RL, in the horizontal direction compared to, of the plurality of insulating films 110, a second side wall SW2 facing the word line cut area WLC. The recess length RL may be greater than 0.

Through such formation, the plurality of word lines 150W overlapping each other in the vertical direction (Z direction) may be isolated from each other.

The specifics of the etching composition are as described above in regard of the etching compositions according to embodiments. In an implementation, in the etching composition used to remove a part of the Mo film 150, the oxidant may include nitric acid, the chelate agent may include phosphoric anhydride, the corrosion inhibitor may include an aliphatic polyamine, and the organic solvent may include a non-aqueous organic solvent including a C1-C5 carboxylic acid compound.

In an implementation, the etching composition used to remove a part of the Mo film 150 may not include water. In an implementation, the etching composition used to remove a part of the Mo film 150 may further include water having a content greater than about 0 wt % and less than about 1 wt % based on the total weight of the etching composition. In an implementation, at least one of the oxidant and the chelate agent included in the etching composition used to remove a part of the Mo film 150 may include a material having a purity less than 100%. In an implementation, a 70% nitric acid reagent, which is available in the market, may be used as the oxidant, and an 85% phosphoric acid reagent, which is available in the market, may be used as the chelate agent. In this case, the nitric acid reagent or the phosphoric acid reagent may already include water. As such, when at least one of the oxidant and the chelate agent of the etching composition includes a material having a purity less than 100%, the etching composition used to remove a part of the Mo film 150 may or may not include additional water.

In removing a part of the Mo film 150 by using the etching composition, the speed of etching the Mo film 150 by the etching composition may be less than 10 Å/min. In an implementation, the speed of etching the Mo film 150 by the etching composition may range from, e.g., about 2 Å/min to about 9 Å/min, or from about 4 Å/min to about 8 Å/min. To help control the speed of etching the Mo film 150 by the etching composition to be in a desired range, the content of the corrosion inhibitor included in the etching composition, e.g., the content of the amine compound may be controlled to be within about 0.01 wt % to about 3 wt %. The higher the content of the corrosion inhibitor in the etching composition, the lower the speed of etching the Mo film 150 by the etching composition. In an implementation, during when a part of the Mo film 150 is removed by using the etching composition, the process temperature may be maintained at a temperature in a range of, e.g., about 10° C. and about 30° C.

In removing a part of the Mo film 150 by using the etching composition according to embodiments, the speed of etching, by the etching composition, parts of the Mo film 150 exposed in the word line cut area WLC may remain relatively constant according to a vertical direction from the substrate 102. In an implementation, the speed of etching, by the etching composition, parts of the Mo film 150 exposed in the word line cut area WLC may be substantially the same or similar at a bottom portion closest to the substrate 102, an upper portion near the inlet furthest from the substrate 102 of the word line cut area WLC, and a middle portion between the bottom portion and the upper portion near the inlet of the word line cut area WLC.

Figure 3:
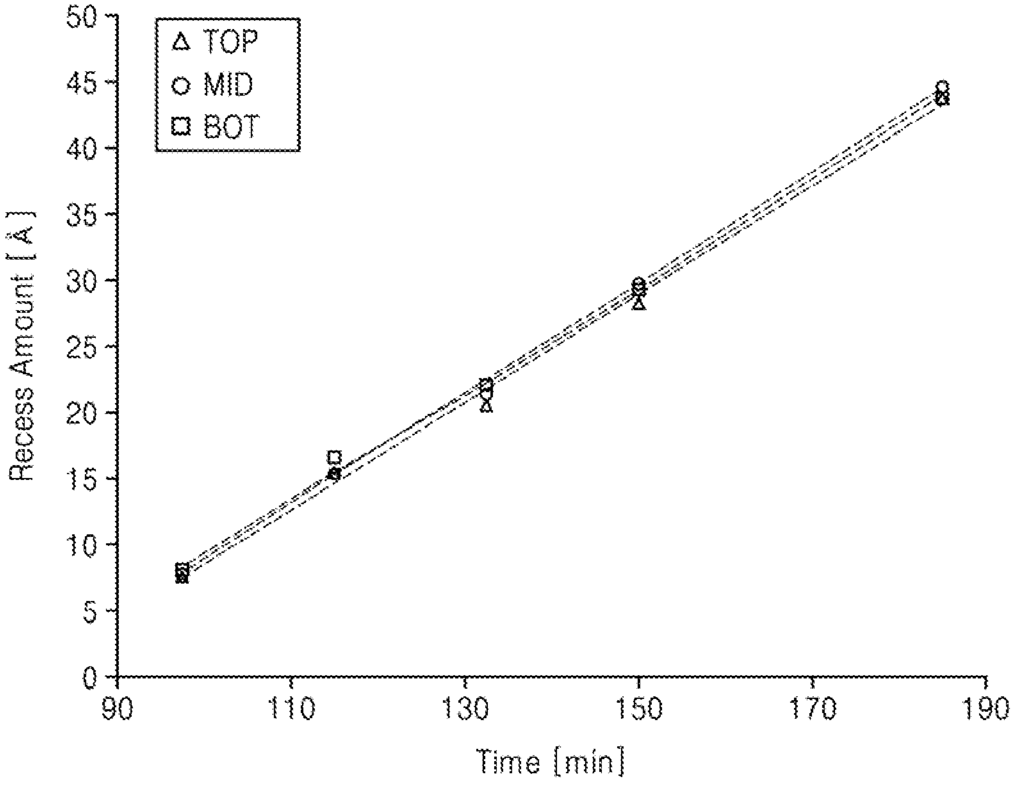
FIG. 3 is a graph showing a result of measurement of etching quantity by an etching composition according to a position on a substrate when forming a plurality of word lines by partially removing a molybdenum film by using the etching composition according to a method of manufacturing an integrated circuit device, according to other embodiments.

FIG. 3 is a graph showing a result of measurement of etching quantity by an etching composition according to a position on a substrate when forming a plurality of word lines by partially removing a Mo film by using the etching composition according to a method of manufacturing an integrated circuit device, according to embodiments.

For estimation in FIG. 3, in a manufacturing process of an integrated circuit device including 3D VNAND flash memory having a structure in which word lines of 200 layers or more overlap each other in the vertical direction, the plurality of word lines 150W were formed by etching a part of the Mo film 150 at the etching speed of about 4 Å/min, as described with reference to FIG. 2H, and according to the etching time, the recess length RL obtained from each of a bottom portion BOT of the word line cut area WLC, closest to the substrate 102, a top portion TOP near an inlet of the word line cut area WLC, farthest from the substrate 102, and a middle portion MID between the bottom portion BOT and the top portion TOP near the inlet was measured. The recess amount of the vertical axis in FIG. 3 represents the recess length RL.

In the outcome of FIG. 3, the etching quantity may increase linearly at each of the bottom portion BOT, the top portion TOP near the inlet, and the middle portion MID according to an etching time, and at each etching time, the recess length RL may be substantially similar at the bottom portion BOT, the top portion TOP near the inlet, and the middle portion MID. From the outcome of FIG. 3, as described with reference to FIG. 2H, when etching a part of the Mo film 150 at a relatively low speed by using the etching composition according to embodiments, the etching quantity of the Mo film 150 may be controlled to remain constant according to a position of the Mo film 150.

With reference to FIG. 2H, after a part of the Mo film 150 is etched by using the etching composition according to embodiments, and the plurality of word lines 150W are formed, the dielectric thin film 140 may be exposed in the word line cut area WLC. During etching of a part of the Mo film 150 using the etching composition, the dielectric thin film 140 may not be etched by the etching composition or even when the dielectric thin film 140 is etched by the etching composition, the etching quantity of the dielectric thin film 140 may be insignificant.

In an implementation, when the dielectric thin film 140 includes an aluminum oxide film, and a part of the Mo film 150 is etched at the temperature of about 15° C. and at the speed of about 4 Å/min by using the etching composition according to embodiments, the etching speed of the dielectric thin film 140 exposed by the etching composition may be about 0 Å/min to about 0.1 Å/min.

With reference to FIG. 2I, by removing exposed parts of the dielectric thin film 140 in the outcome of FIG. 2H, a plurality of dielectric patterns 140P may be formed. After the plurality of dielectric patterns 140P are formed, in the word line cut area WLC, the side wall of each of the plurality of insulating films 110 and the upper surface of the common source area 160 may be exposed.

With reference to FIG. 2J, in the outcome of FIG. 2I, an insulating spacer 170 and a common source line CSL may be formed in the word line cut area WLC, and a capping insulating film 172 covering an upper surface of each of the insulating spacer 170 and the common source line CSL may be formed in the word line cut area WLC.

Each of the insulating spacer 170 and the capping insulating film 172 may include a silicon oxide film, a silicon nitride, a silicon oxynitride, or a combination thereof. The common source line CSL may include a metal, e.g., tungsten, copper, aluminum, or the like; a conductive metallic nitride, e.g., titanium nitride, tantalum nitride, etc.; a transition metal, such as titanium, tantalum, or the like; or a combination thereof. In an implementation, a metal silicide film (to lower contact resistance) may be arranged between the common source area 160 and the common source line CSL. In an implementation, the metal silicide film may include cobalt silicide, tungsten silicide, nickel silicide, or the like.

According to a method of manufacturing an integrated circuit device, described with reference to FIGS. 1 and 2A to 2J, in a manufacturing process of an integrated circuit device with a high integration degree, by controlling an etching speed of a Mo film, a target etching quantity of the Mo film may be controlled, and by inhibiting generation of undesired residue during the etching of the Mo film, the manufacturing process of an integrated circuit device including the Mo film may be simplified, which leads to improved reliability of the resulting integrated circuit device.

By way of summation and review, as the stacking density of the memory cells in the vertical memory device increases, the gate length may be reduced, and a distance between adjacent memory cells in the vertical direction may decrease, which could lead to deteriorated reliability of the integrated circuit device.

One or more embodiments may provide an etching composition capable of controlling an etching speed of a molybdenum (Mo) film applied to an integrated circuit device with a high integration degree, and inhibiting generation of residues derived from the etching composition.

One or more embodiments may provide a method of manufacturing an integrated circuit device capable of controlling a target etching quantity of a Mo film by controlling an etching speed of the Mo film in a manufacturing process of the integrated circuit device with a high integration degree and inhibiting generation of undesired residues during the etching of the Mo film to improve reliability of the integrated circuit device including the Mo film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An etching composition for etching a molybdenum film, the etching composition comprising:

0.1 wt % to 5 wt % of an oxidant;

8.5 wt % to 34 wt % of a chelating agent, the chelating agent including a mineral acid;

0.01 wt % to 3 wt % of a corrosion inhibitor, the corrosion inhibitor including at least one corrosion inhibitor selected from the group consisting of an ammonium salt and an amine compound;

an organic solvent; and less than 1 wt % of water, all wt % being based on a total weight of the etching composition, wherein the etching composition does not include hydrogen peroxide.

2. The etching composition as claimed in claim 1, wherein the oxidant includes at least one oxidant selected from the group consisting of nitric acid, sulfuric acid, perchloric acid, ammonium persulfate, methanesulfonic acid, and paratoluenesulfonic acid.

3. The etching composition as claimed in claim 1, wherein the chelating agent includes at least one chelating agent selected from the group consisting of phosphoric acid, a phosphoric acid salt, phosphonic acid, and a phosphonic acid salt.

4. The etching composition as claimed in claim 1, wherein:

the ammonium salt includes at least one ammonium salt selected from the group consisting of monoammonium phosphate, diammonium phosphate, triammonium phosphate, ammonium chloride, ammonium acetate, ammonium carbonate, ammonium nitrate, and ammonium sulfate, and the amine compound includes a C1-C8 aliphatic amine compound or a 5-membered to 8-membered cyclic amine compound.

5. The etching composition as claimed in claim 1, wherein the organic solvent includes at least one non-aqueous organic solvent selected from the group consisting of a C1-C5 carboxylic acid compound, a C1-C5 alcohol compound, and a C1-C5 carbonic acid ester compound.

6. A method of manufacturing an integrated circuit device, the method comprising:

forming, on a substrate, an insulating film structure defining a plurality of spaces arranged apart from each other;

forming a molybdenum film filling the plurality of spaces and covering the insulating film structure; and removing a part of the molybdenum film from outside of the plurality of spaces by using an etching composition to obtain a plurality of molybdenum patterns filling the plurality of spaces and spaced apart from each other, wherein the etching composition includes:

0.1 wt % to 5 wt % of an oxidant;

8.5 wt % to 34 wt % of a chelating agent, the chelating agent including a mineral acid;

0.01 wt % to 3 wt % of a corrosion inhibitor, the corrosion inhibitor including at least one corrosion inhibitor selected from the group consisting of an ammonium salt and an amine compound;

an organic solvent; and less than 1 wt % of water, all wt % being based on a total weight of the etching composition, wherein the etching composition does not include hydrogen peroxide.

7. The method as claimed in claim 6, wherein removing the part of the molybdenum film includes etching the molybdenum film at an etching speed of less than 10 Å/min.

8. The method as claimed in claim 6, wherein removing the part of the molybdenum film is performed at a temperature selected from a range from 10° C. to 30° C.

9. The method as claimed in claim 6, wherein the plurality of spaces extend in a first direction parallel with a main surface of the substrate and overlap each other in a second direction perpendicular to the main surface of the substrate.

10. The method as claimed in claim 6, wherein the oxidant in the etching composition includes at least one oxidant selected from the group consisting of nitric acid, sulfuric acid, perchloric acid, ammonium persulfate, methanesulfonic acid, and paratoluenesulfonic acid.

11. The method as claimed in claim 6, wherein the chelating agent in the etching composition includes at least one chelating agent selected from the group consisting of phosphoric acid, a phosphoric acid salt, phosphonic acid, and a phosphonic acid salt.

12. The method as claimed in claim 6, wherein:

the ammonium salt includes at least one ammonium salt selected from the group consisting of monoammonium phosphate, diammonium phosphate, triammonium phosphate, ammonium chloride, ammonium acetate, ammonium carbonate, ammonium nitrate, and ammonium sulfate, and the amine compound includes a C1-C8 aliphatic amine compound or a 5-membered to 8-membered cyclic amine compound.

13. The method as claimed in claim 6, wherein the organic solvent includes at least one non-aqueous organic solvent selected from the group consisting of a C1-C5 carboxylic acid compound, a C1-C5 alcohol compound, and a C1-C5 carbonic acid ester compound.

14. A method of manufacturing an integrated circuit device, the method comprising:

forming, on a substrate, a structure in which a plurality of first films and a plurality of second films are stacked alternately one by one;

forming a channel hole penetrating the structure in a vertical direction;

forming a channel structure in the channel hole;

forming a word line cut area penetrating the structure in the vertical direction and extending in a shape of a line in a horizontal direction;

forming a plurality of word line spaces by removing the plurality of first films exposed in the word line cut area;

forming a molybdenum film filling the plurality of word line spaces and covering surfaces of the plurality of second films exposed in the word line cut area; and removing a part of the molybdenum film by applying an etching composition through the word line cut area to obtain a plurality of word lines including a plurality of molybdenum patterns filling the plurality of word line spaces and arranged apart from each other, wherein the etching composition includes:

0.1 wt % to 5 wt % of an oxidant;

8.5 wt % to 34 wt % of a chelating agent, the chelating agent including a mineral acid;

0.01 wt % to 3 wt % of a corrosion inhibitor, the corrosion inhibitor including at least one corrosion inhibitor selected from the group consisting of ammonium salt and an amine compound;

an organic solvent; and less than 1 wt % of water, all wt % being based on a total weight of the etching composition, wherein the etching composition does not include hydrogen peroxide.

15. The method as claimed in claim 14, further comprising, after forming the plurality of word line spaces and before the forming of the molybdenum film, forming a dielectric thin film conformally covering the surfaces of the plurality of second films and a surface of the channel structure, which are exposed in the plurality of word line spaces and the word line cut area, wherein:

forming the molybdenum film includes forming the molybdenum film to fill spaces limited by the dielectric thin film, of the plurality of word line spaces, and after removing the part of the molybdenum film, parts of the dielectric thin film which cover the surfaces of the plurality of second films in the word line cut area are exposed.

16. The method as claimed in claim 14, wherein removing the part of the molybdenum film includes etching the molybdenum film at an etching speed of less than 10 Å/min.

17. The method as claimed in claim 14, wherein:

the oxidant includes nitric acid, the chelating agent includes phosphoric anhydride, the corrosion inhibitor includes an aliphatic polyamine, and the organic solvent is a non-aqueous organic solvent, the non-aqueous organic solvent including a C1-C5 carboxylic acid compound.

* * * * *